(12) United States Patent
Takahashi et al.

(10) Patent No.: US 11,812,543 B2
(45) Date of Patent: Nov. 7, 2023

(54) ELECTROMAGNETIC WAVE SHIELDING FILM

(71) Applicant: TATSUTA ELECTRIC WIRE & CABLE CO., LTD., Osaka (JP)

(72) Inventors: Akio Takahashi, Kyoto (JP); Tsunehiko Terada, Kyoto (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 896 days.

(21) Appl. No.: 16/087,698

(22) PCT Filed: Feb. 21, 2017

(86) PCT No.: PCT/JP2017/006301
§ 371 (c)(1),
(2) Date: Sep. 24, 2018

(87) PCT Pub. No.: WO2017/169297
PCT Pub. Date: Oct. 5, 2017

(65) Prior Publication Data
US 2019/0098742 A1    Mar. 28, 2019

(30) Foreign Application Priority Data

Mar. 31, 2016   (JP) ................. 2016-072293

(51) Int. Cl.
*C09D 5/24* (2006.01)
*H05K 9/00* (2006.01)
(Continued)

(52) U.S. Cl.
CPC .......... *H05K 9/0083* (2013.01); *B32B 27/18* (2013.01); *C09D 5/24* (2013.01); *C09D 7/61* (2018.01);
(Continued)

(58) Field of Classification Search
CPC ...... H05K 9/0083; H05K 1/0215; H05K 9/00; H05K 1/023; H05K 1/181;
(Continued)

(56) References Cited

U.S. PATENT DOCUMENTS 10,864,701 B2 * 12/2020 Takahashi .................. C09J 7/20
2003/0199607 A1    10/2003 Cheng
(Continued)

FOREIGN PATENT DOCUMENTS

CN    1586098 A    2/2005
CN    1701097 A    11/2005
(Continued)

OTHER PUBLICATIONS

International Search Report dated May 16, 2017 filed in PCT/JP2017/006301.
(Continued)

*Primary Examiner* — Samir Shah
(74) *Attorney, Agent, or Firm* — Rankin, Hill & Clark LLP

(57) ABSTRACT

Provided is an electromagnetic wave shielding film capable of reducing a space formed between the electromagnetic wave shielding film and an electronic component on a wiring substrate and to increase an electromagnetic wave shielding effect. An electromagnetic wave shielding film 1 includes a conductive layer 3 having stretchability and a property of hardly returning to an original state thereof when once stretched, and an adhesion layer 4 formed on one surface of the conductive layer 3 and having insulating properties. The conductive layer 3 is made of a conductive composition, including a resin having stretchability and a property of hardly returning to an original state thereof when
(Continued)

once stretched and a conductive filler filled with the resin. The resin has a tensile permanent set of 2.5% or more and 90% or less.

5 Claims, 3 Drawing Sheets

(51) Int. Cl.
*B32B 27/18* (2006.01)
*C09D 7/40* (2018.01)
*C09D 7/61* (2018.01)
*H05K 1/02* (2006.01)
*H05K 1/18* (2006.01)

(52) U.S. Cl.
CPC ............... *C09D 7/69* (2018.01); *H05K 1/023* (2013.01); *H05K 1/0215* (2013.01); *H05K 9/00* (2013.01); *H05K 1/181* (2013.01); *H05K 2201/0715* (2013.01)

(58) Field of Classification Search
CPC .... H05K 2201/0715; C09D 5/24; C09D 7/61; C09D 7/69; B32B 27/18; B32B 7/02
See application file for complete search history.

(56) References Cited

U.S. PATENT DOCUMENTS

| | | |
|---|---|---|
| 2005/0012652 A1 | 1/2005 | Wakayama |
| 2010/0203789 A1 | 8/2010 | Takebayashi |
| 2011/0065217 A1* | 3/2011 | Terada ................ H01L 21/6836 438/17 |
| 2015/0201535 A1 | 7/2015 | Su |
| 2017/0194073 A1 | 7/2017 | Takahashi |

FOREIGN PATENT DOCUMENTS

| | | |
|---|---|---|
| CN | 101050307 A | 10/2007 |
| CN | 101375652 A | 2/2009 |
| JP | 2000036686 A | 2/2000 |
| JP | 2004176005 A | 6/2004 |
| JP | 2008027973 A | 2/2008 |
| JP | 2009138141 A | 6/2009 |
| JP | 2014-78573 A | 5/2014 |
| JP | 2015-138813 A | 7/2015 |
| JP | 2016-157838 A | 9/2016 |
| WO | 2016017644 A1 | 2/2016 |

OTHER PUBLICATIONS

Chinese Office Action dated Jun. 27, 2019 for the corresponding Chinese Application No. 201780019482.7.
Japanese Office Action (JPOA) dated Jan. 9, 2020 for the corresponding Japanese Patent Application No. 2016-072293 and its English machine translation.
Taiwanese Office Action (TWOA) dated Mar. 30, 2020 for the corresponding Taiwanese Patent Application No. 105140099.
Extended European Search Report dated Oct. 28, 2019 for the corresponding European Patent Application No. 17773845.7.
European Office Action (EPOA) dated Jun. 22, 2023 for European Patent Application No. 17773845.7.

* cited by examiner

ELECTROMAGNETIC WAVE SHIELDING FILM

TECHNICAL FIELD

The present invention relates to an electromagnetic wave shielding film.

BACKGROUND ART

An electromagnetic wave shielding material including a pressure sensitive adhesive, a conductive nonwoven fabric layer formed on the pressure sensitive adhesive, and an insulating layer formed on the conductive nonwoven fabric layer has been proposed. The conductive nonwoven fabric is a nonwoven fabric knitted with fibers coated with a metal thin film.

CITATION LIST

Patent Literature

PATENT LITERATURE 1: JP-A-2000-036686

SUMMARY OF THE INVENTION

Problems to be Solved by the Invention

The above-described conventional electromagnetic wave shielding material is provided, for example, on a mounting surface side of a wiring substrate (printed circuit board) so as to cover an electronic component mounted on the printed circuit board. A plurality of electronic components is mounted on the mounting surface of the wiring substrate. Therefore, the surface of the wiring substrate on which the electronic components are mounted has irregularities. The conventional electromagnetic wave shielding material includes a conductive nonwoven fabric layer. Thus, the electromagnetic wave shielding material has almost no stretchability. Therefore, when the electromagnetic wave shielding material is provided on the surface of the wiring substrate on which the electronic components are mounted, a space is easily formed between the electronic components and the electromagnetic wave shielding material. As a result, electromagnetic wave leakage occurs and electromagnetic wave shielding effect is deteriorated.

An object of the present invention is to provide an electromagnetic wave shielding film capable of reducing a space formed between the electromagnetic wave shielding film and an electronic component on a wiring substrate, and to, therefore, increase an electromagnetic wave shielding effect as a result.

Solution to the Problems

[1] An electromagnetic wave shielding film according to the present invention includes a conductive layer having stretchability, and an adhesion layer formed on one surface of the conductive layer and having insulating properties, wherein the conductive layer includes a conductive composition comprising a resin having stretchability and a conductive filler filled with the resin, and the resin has a tensile permanent set of 2.5% or more and 90% or less.

In this configuration, the electromagnetic wave shielding film includes the conductive layer having stretchability. The conductive layer includes the resin having stretchability and having a tensile permanent set of 2.5% or more or less. Therefore, the electromagnetic wave shielding film has stretchability and has a property of hardly returning to an original state thereof when once stretched.

The electromagnetic wave shielding film is applied to, for example, a wiring substrate having an electronic component mounted thereon. In this case, the electromagnetic wave shielding film is mounted on the wiring substrate so that its surface on the adhesive layer side faces the mounting surface of the wiring substrate and it covers the electronic component. Thus, the electromagnetic wave shielding film is temporarily fixed to the wiring substrate. Thereafter, the electromagnetic wave shielding film is lightly pressed against the mounting surface side of the wiring substrate. The electromagnetic wave shielding film has stretchability and has the property of hardly returning to the original state when once stretched. Therefore, the electromagnetic wave shielding film is stretched, to be deformed along an outer surface of the electronic component on the wiring substrate. The electromagnetic wave shielding film maintains this state. Thus, it is possible to reduce the space formed between the electromagnetic wave shielding film and the electronic component on the wiring substrate. Therefore, it is possible to increase the electromagnetic wave shielding effect.

[1] The electromagnetic wave shielding film according to the above-mentioned [1] may include the resin having a breaking strength of 20 MPa or more and 80 MPa or less and an elongation at break of 300% or more and 700% or less.

[3] The electromagnetic wave shielding film according to the above-mentioned [1] or [2] may further include an insulating layer formed on a surface opposite to the adhesion layer side of the conductive layer.

[4] The electromagnetic wave shielding film according to any one of the above-mentioned [1] to [3] may include the conductive filler being dendritic.

[5] The electromagnetic wave shielding film according to the above-mentioned [4] may include the conductive filler being silver powder.

[6] The electromagnetic wave shielding film according to the above-mentioned [4] may include the conductive filler being copper powder.

[7] The electromagnetic wave shielding film according to the above-mentioned [4] may include the conductive filler being silver-coated copper powder made of copper powder coated with silver.

[8] The electromagnetic wave shielding film according to any one of the above-mentioned [1] to [3] may include the conductive filler having a coil shape.

DESCRIPTION OF THE EMBODIMENTS

[1] Configuration of Electromagnetic Wave Shielding Film

Figure 1:
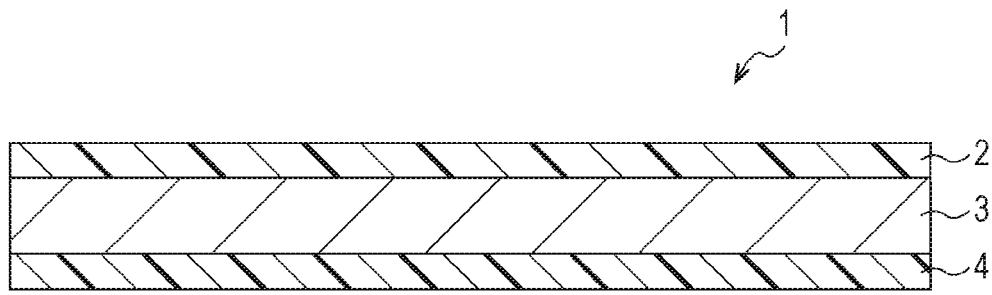
FIG. 1 is a schematic cross-sectional view showing a configuration of an electromagnetic wave shielding film according to an embodiment of the present invention.

FIG. 1 is a schematic cross-sectional view showing a configuration of an electromagnetic wave shielding film according to an embodiment of the present invention.

An electromagnetic wave shielding film 1 includes an insulating layer (a protective layer) 2 having electrical insulation properties, a conductive layer 3, and an adhesive layer 4. The conductive layer 3 is formed on one surface of the insulating layer 2, has stretchability, and has a property of hardly returning to an original state thereof when once stretched. The adhesive layer 4 is formed on a surface opposite to the insulating layer 2 side of the conductive layer 3 and has insulating properties. The electromagnetic wave shielding film 1 is sheet-like. To have stretchability means to have a property of stretching easily.

The insulating layer 2 has a thickness of about 5 to 50 μm. The conductive layer 3 has a thickness of about 10 to 100 μm. The pressure sensitive adhesive 4 has a thickness of about 10 to 150 μm.

[2] Adhesion Layer

As the adhesion layer 4, for example, an adhesive layer, a hot melt adhesion layer, or the like can be used.

Examples of material of adhesive used for the pressure sensitive adhesive as the adhesion layer 4 include a rubber-based, an acrylic-based, a polyester-based, a silicone-based, and a urethane-based adhesive.

Examples of material of hot melt adhesive used for the hot melt adhesion layer as the adhesion layer 4 include thermoplastic resins such as polyester-based, polyurethane-based, polyamide-based, olefin-based and ethylene vinyl acetate-based. The hot melt adhesive in the present invention preferably has a melting point of 130° C. or less, a durometer hardness of 95 A or less, and an elongation at break of 300% or more. The hot melt adhesive of the present invention more preferably has the melting point of 120° C. or less, the durometer hardness of 85 A or less, and the elongation at break of 500% or more. More specifically, a polyurethane thermoplastic resin such as "SHM 101-PUR" manufactured by Sheedom Co., Ltd. can be used as the hot melt adhesive.

[3] Conductive Layer

The conductive layer 3 is made of a conductive composition, including a resin (hereinafter referred to as a "conductive layer resin") having stretchability and having a property of hardly returning to an original state thereof when once stretched and a conductive filler filled with the resin.

A tensile permanent set of the conductive layer resin is preferably 2.5% or more and 90% or less, and more preferably 20% or more and 80% or less. The reason for this is as follows. The electromagnetic wave shielding film 1 is arranged along an outer surface shape of electronic components and the like. For this purpose, the conductive layer 3 preferably has stretchability and has a property of hardly returning to an original state thereof when once stretched and has a property of slightly returning after once stretched. Here, when the tensile permanent set of the conductive layer resin is less than 2.5%, it is difficult for the conductive layer 3 to exhibit the property of hardly returning to the original state when once stretched. In addition, when the tensile permanent set of the conductive layer resin exceeds 90%, the conductive layer 3 easily exhibit the property of hardly returning to the original state when once stretched, but it is difficult for the conductive layer 3 to exhibit the property of slightly returning after once stretched.

The conductive layer resin preferably has a breaking strength of 20 MPa or more and 80 MPa or less. The conductive layer resin preferably has an elongation at break of 300% or more and 700% or less. The conductive layer resin preferably has Shore A strength of 20 or more and 50 or less.

[3-1] Conductive Layer Resin

The conductive layer resin includes an elastomer and a thermoplastic resin. Examples of the elastomer used as the conductive layer resin include resins having elasticity such as a styrene-based elastomer, an olefin-based elastomer, a polyester-based elastomer, a polyurethane-based elastomer, a polyamide-based elastomer, a silicone-based elastomer and the like. The polyurethane-based elastomer includes a hard segment and a soft segment. Examples of soft segments include carbonates, esters, and ethers. Preferred physical properties are the breaking strength of 20 to 80 MPa, the elongation at break of 300 to 700%, and the permanent tensile strain of 2.5 to 90%. More preferable physical properties are the breaking strength of 30 to 70 MPa, the elongation at break of 400 to 600%, and the tensile permanent set of 20 to 80%.

Specifically, NE-8880, MAU-9022, NE-310, NE-302 HV, CU-8448 or the like manufactured by Dainichiseika Color & Chemicals Mfg. Co., Ltd. can be used. As the polyurethane-based elastomer, PANDEX 372E manufactured by DIC Corporation can be used. The elastomer may contain a single resin or a plurality of kinds of resins. From a viewpoint of improving manufacturability (processability), flexibility and the like, the elastomer may contain additives such as a plasticizer, a processing aid, a crosslinking agent, a vulcanization accelerator, a vulcanization aid, an antioxidant, a softener, or a colorant.

Table 1 shows the physical properties of Comparative Example and Examples of the conductive layer resin.

TABLE 1

| Physical properties | Comparative Example | Example 1 | Example 2 | Example 3 |
|---|---|---|---|---|
| Viscosity (dPa · s/20° C.) | 240 | 275 | 230 | 150 |
| Breaking strength (MPa) | 76 | 69 | 54 | 30 |
| Elongation at break (%) | 340 | 440 | 460 | 550 |
| Permanent strain (%) | Breaking | 2.6 | 30 | 71 |

The conductive layer resin of Comparative Example includes the urethane elastomer. The conductive layer resin of Examples 1, 2 and 3 include the urethane elastomer.

The breaking strength [MPa] is a tensile stress just before breaking. Elongation at break [%] is elongation just before breaking. A method of measuring the breaking strength and the elongation at break is based on JIS K 6251: 2010 (Vulcanized rubber and thermoplastic rubber–Determination of tensile properties). The measuring method will be described in detail below. A method of measuring the tensile permanent set [%] is based on JIS K 6273: 2006 (Vulcanized rubber and thermoplastic rubber–Determination of tensile permanent set, elongation rate and creep rate). The measuring method will be described in detail below.

The method of measuring the breaking strength and the elongation at break will be described. A test piece having a length of 20 mm, a width of 15 mm, and a thickness of 40±5 μm is prepared in advance for each of Comparative Example, Example 1, Example 2 and Example 3. The test piece is attached to a tensile strain retainer. Then, the test piece is pulled until the test piece is broken at a speed of 200 mm/min. A load and an elongation rate just before the test piece breaks are respectively determined as the breaking strength and the elongation at break.

The method of measuring the tensile permanent set will be described.

The test piece having a length of 20 mm, a width of 15 mm, and a thickness of 40±5 μm is prepared in advance for each of Comparative Example, Example 1, Example 2 and Example 3.

The test piece is attached to the tensile strain retainer. Then, the test piece is stretched to a length (60 mm) corresponding to the elongation rate of 200% at the speed of 200 mm/min. The test piece is held for 10 minutes in a state of being stretched to 60 mm. Thereafter, the test piece is detached from the tensile strain retainer. Then, the test piece is allowed to stand for 30 minutes with a pulling force released. When the 30 minutes have elapsed, a length of the test piece (length of the test piece after shrinkage) is measured.

When the length of the initial test piece is L0, the length of the test piece after elongation is L1, and the length of the test piece after shrinkage is L2, a tensile permanent set TS is expressed by the following equation (1).

$$TS = \{(L2-L0)/(L1-L0)\} \times 100 \quad (I)$$

The conductive layer resin of Examples 1, 2, and 3 exhibited a property that it was easy to stretch when pulled and hard to return to the original state when once stretched. In contrast, the conductive layer resin of Comparative Example exhibited a property that it was hard to stretch and easy to break when stretched.

From such a fact, in order to have stretchability and obtain a property of hardly returning to the original state when once stretched, it can be inferred that the tensile permanent set of the conductive layer resin is preferably 2.5% or more and 90% or less, and more preferably 20% or more and 80% or less. Further, it is inferred that the breaking strength of the conductive layer resin is preferably 20 MPa or more and 80 MPa or less. Further, it can be inferred that the elongation at break of the conductive layer resin is preferably 300% or more and 700% or less.

[3-2] Conductive Filler

A shape of the conductive filler may be dendrite, coil, bulk, sphere, flake, needle, fiber, or the like. The dendrite shape refers to a shape of a rod-like main branch having a rod-like bifurcated branch extending in two-dimensional direction or three-dimensional direction. Further, the dendrite shape includes a shape having the bifurcated branch bent in the middle and a shape having a rod-like bifurcated branch further extending from the middle of the bifurcated branch.

The dendritic conductive filler will be described in detail. The dendritic conductive filler may be, for example, dendritic copper powder or silver powder. Or, the conductive filler may be silver-coated copper powder made of dendritic copper powder coated with silver. Further, the conductive filler may be gold-coated copper powder made of dendritic copper powder coated with gold. When the conductive filler is made of dendritic silver-coated copper powder, the conductive filler has a resistance value close to that of the conductive filler made of silver although it is relatively inexpensive. That is, the conductive filler having excellent conductivity and migration resistance can be realized. Further, when the conductive filler is made of dendritic copper powder, it is possible to realize the conductive filler having a low resistance value although it is inexpensive.

When the conductive filler is made of dendritic silver-coated copper powder, the polyurethane-based elastomer is preferably used as the elastomer. In this case, the polyurethane-based elastomer has a volume resistivity of $10^{10-13}$ Ωcm lower by about two digits than other elastomers. Further, the polyurethane-based elastomer has a high affinity to the conductive filler containing silver. Therefore, it is possible to stretch the conductive composition satisfactorily.

A lower limit of an average particle size of the conductive filler is 1 μm, preferably 2 μm. When the lower limit is 1 μm or more, the conductive fillers tend to come into contact with each other. Therefore, the conductive composition has excellent conductivity. An upper limit of the average particle size of the conductive filler is 20 μm, preferably 10 μm. When the upper limit is 20 μm or less, the thickness of the conductive layer made of conductive composition can be reduced.

With the conductive filler having a coil shape (including a helix shape and a spiral shape), when the elastomer is stretched, the conductive filler is stretched as when the coil is pulled. Therefore, even when the elastomer is stretched, it is possible to suppress the conductive composition from increasing in the resistance value. Thus, it is possible to provide the conductive composition having stretchability and capable of suppressing an increase in the resistance value when stretched.

A filling rate of the conductive filler in the conductive composition (conductive layer 3) is preferably 60 mass % or more and 90 mass % or less.

[3-3] Conductive Paste

A conductive paste used for forming the conductive layer 3 can be produced, for example, as follows. For example, the dendritic silver-coated copper powder having an average particle size of 5 μm was blended to the conductive layer resin so that the filling rate of the silver-coated copper powder (filling rate of the conductive filler in the conductive composition) is a predetermined mass % (for example, 80 mass %). Next, for example, 40 parts by mass of a mixed solvent of isopropyl alcohol and toluene (a weight ratio of isopropyl alcohol to toluene is, for example, 5:5) is added to 100 parts by mass of the conductive layer resin. Next, stirring by a planetary stirrer was performed. Thus, a solution (the conductive paste) containing the conductive layer resin, the silver-coated copper powder and an organic solvent was obtained. It goes without saying that dendritic conductive fillers such as dendritic silver powder, or coil-shaped conductive fillers or the like can be used instead of the dendritic silver-coated copper powder.

[4] Insulating Layer

As the insulating layer 2, for example, the elastomer used as the above-described conductive layer resin filled with carbon black can be used. Similarly, the insulating layer 2 may contain the additives such as the plasticizer, the processing aid, the crosslinking agent, the vulcanization accelerator, the vulcanization aid, the antioxidant, the softener, or the colorant.

[5] Method for Producing Electromagnetic Wave Shielding Film

Figure 2A:
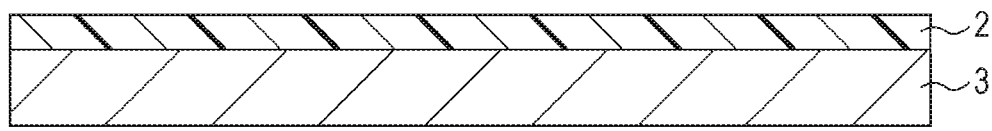
FIG. 2A is a schematic cross-sectional view showing a process of producing the electromagnetic wave shielding film of FIG. 1.
Figure 2B:
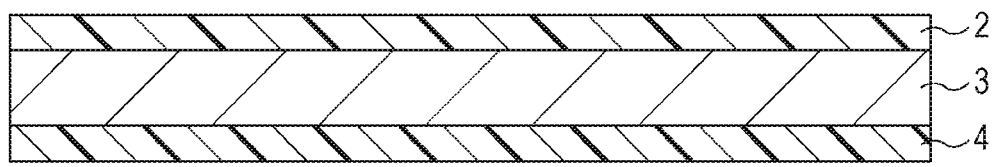
FIG. 2B is a schematic cross-sectional view showing a process following FIG. 2A.

FIGS. 2A and 2B are process diagrams showing a method for producing the electromagnetic wave shielding film 1.

First, as shown in FIG. 2A, the conductive layer 3 is formed on the one surface of the insulating layer 2. Specifically, the conductive paste which is a material of the conductive layer 3 is applied to the one surface of the insulating layer 2. Next, heat drying is performed. Subsequently, as shown in FIG. 2B, the adhesion layer 4 is formed on the surface opposite to the insulating layer 2 of the conductive layer 3. Thus, the electromagnetic wave shielding film 1 is obtained.

[6] Explanation of Method of Using Electromagnetic Wave Shielding Film

Figure 3A:
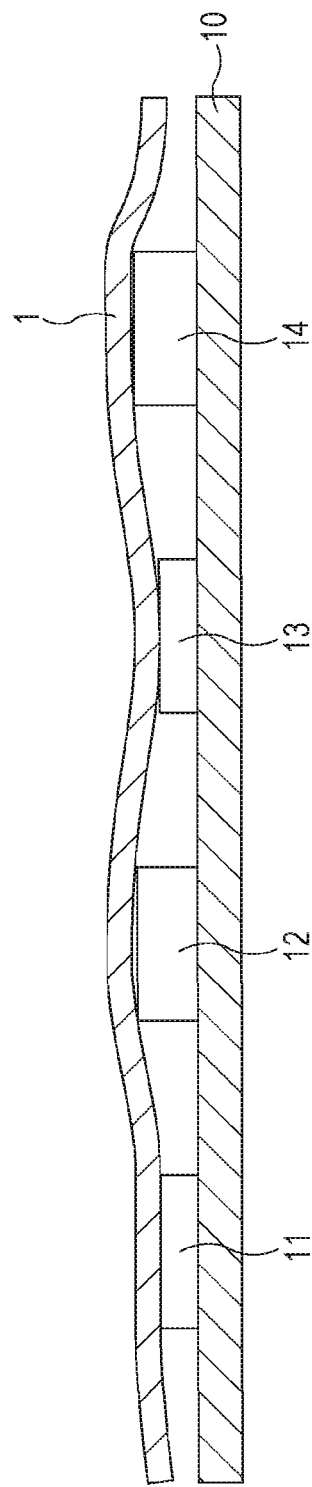
FIGS. 3A and 3B are schematic cross-sectional views for explaining a method of using the electromagnetic wave shielding film of FIG. 1.
Figure 3B:
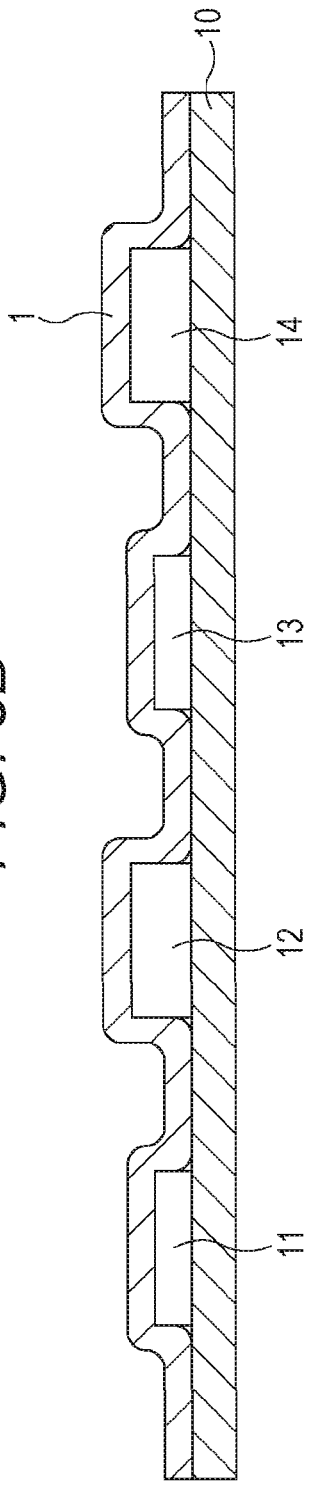

FIGS. 3A and 3B are schematic cross-sectional views for explaining a method of using the electromagnetic wave shielding film.

A plurality of kinds of electronic components 11 to 14 is mounted on a mounting surface side of a wiring substrate 10 (see FIG. 3A). Heights of these electronic components 11 to 14 are not uniform. As shown in FIG. 3A, the electromagnetic wave shielding film 1 is mounted on the wiring substrate 10 so that a surface thereof on the adhesion layer 4 side faces the mounting surface of the wiring substrate 10 and the electromagnetic wave shielding film 1 covers the electronic components 11 to 14. Thus, the electromagnetic wave shielding film 1 is fixed to the wiring substrate 10.

Thereafter, the electromagnetic wave shielding film 1 is lightly pressed against the mounting surface side of the wiring substrate 10 by a jig made of flexible rubber or the like. Then, since the electromagnetic wave shielding film 1 has the conductive layer 3, having the stretchability and having the property of hardly returning to the original state when once stretched, the electromagnetic wave shielding film 1 is stretched as shown in FIG. 3B. Then, the electromagnetic wave shielding film 1 is deformed along outer surfaces (upper surfaces and side surfaces) of the electronic components 11 to 14 on the wiring substrate 10. Then, the electromagnetic wave shielding film 1 maintains this state. Thus, it is possible to reduce a space formed between the electromagnetic wave shielding film 1 and the electronic components 11 to 14 on the wiring substrate 10. As a result, it is possible to increase the electromagnetic wave shielding effect.

Figure 4:
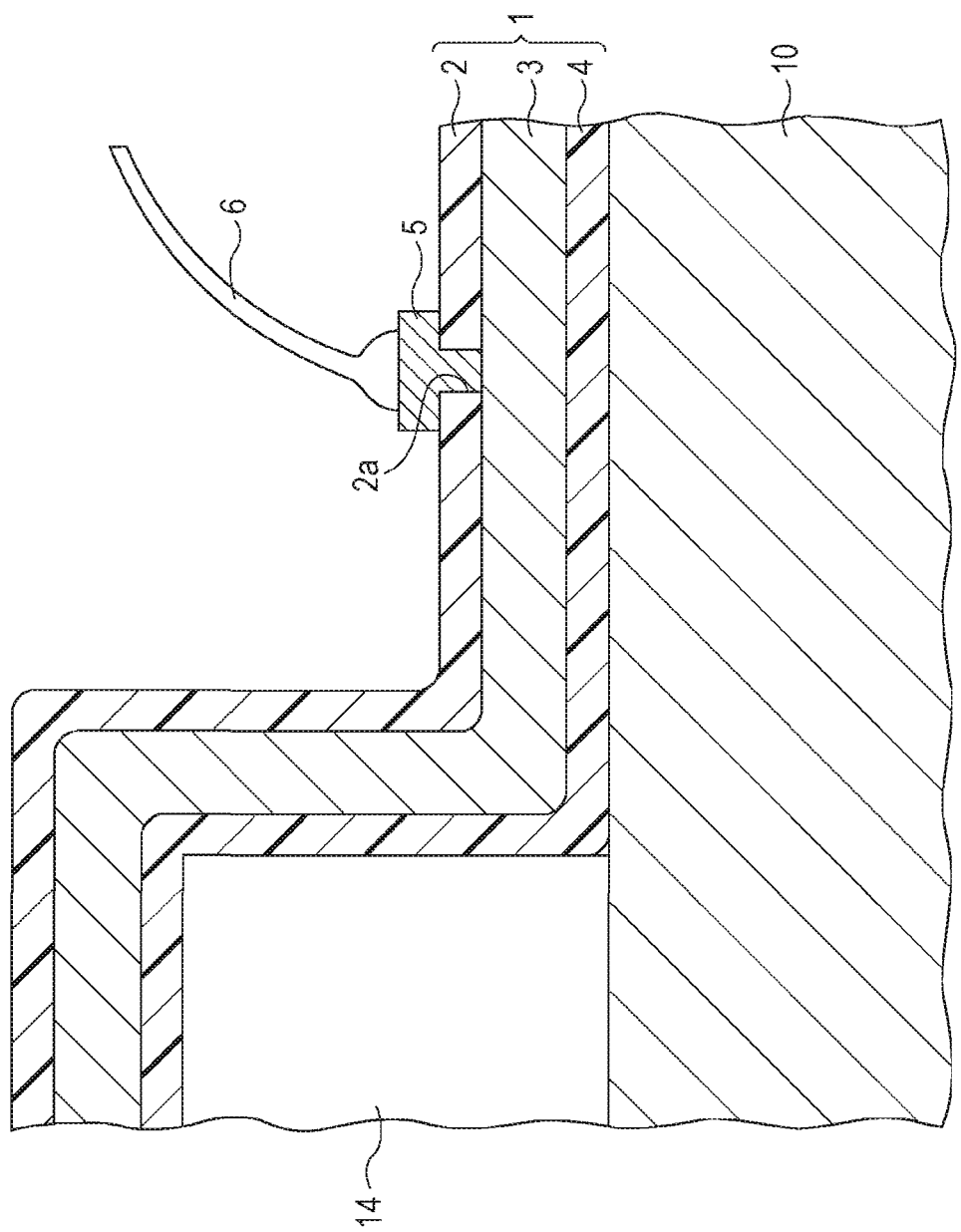
FIG. 4 is a schematic cross-sectional view showing an example of a method of grounding a conductive layer of the electromagnetic wave shielding film.

As shown in FIG. 4, a through-hole 2a extending from a surface of the insulating layer 2 to the conductive layer 3 may be formed, and a pad 5 electrically connected to the conductive layer 3 may be formed on the insulating layer 2. The pad 5 can be connected to a ground via a wiring 6. A position of the pad 5 may be arbitrary. The position may be an upper portion covered with the electromagnetic wave shielding film 1 on the electronic component. Further, the ground need not be a ground dedicated wiring. Furthermore, the ground may be a housing of an electronic device.

In the above-described embodiment, the electromagnetic wave shielding film 1 includes the insulating layer 2, the conductive layer 3 formed on the one surface of the insulating layer 2 and having stretchability and the property of hardly returning to the original state when once stretched, and the insulating adhesion layer 4 formed on the surface opposite to the insulating layer 2 side of the conductive layer 3. However, the insulating layer 2 may not be formed.

In addition, it is possible to make various design changes within the scope of matters described in claims.

The present international application is a priority claimed application based on Japanese Patent Application No. 2016-072293 filed on Mar. 31, 2016. The entire contents of Japanese Patent Application No. 2016-072293 are incorporated into the present international application.

The above descriptions of a specific embodiment of the present invention have been presented for the purpose of exemplification. They are not intended to be exhaustive or to limit the present invention to the described embodiment. It will be apparent to those skilled in the art that numerous variations or modifications can be made in light of the above description.

LIST OF REFERENCE NUMERALS

1: Electromagnetic wave shielding film
2: Insulating layer
3: Conductive layer
4: Adhesion layer

The invention claimed is:

1. An electromagnetic wave shielding film comprising:
an insulating layer having electrical insulation properties;
a conductive layer having stretchability;
an adhesion layer formed on one surface of the conductive layer and having insulating properties;
a through-hole extending only from a surface of the insulating layer to a surface of the conductive layer, which is in direct contact with the insulating layer; and
a pad electrically connected to the conductive layer and formed directly on the insulating layer, wherein
the conductive layer includes a conductive composition comprising a resin having stretchability and a conductive filler filled with the resin; wherein the conductive filler is dendritic, and
the resin has a tensile permanent set of 2.5% or more and 90% or less.

2. The electromagnetic wave shielding film according to claim 1, wherein
the resin has a breaking strength of 20 MPa or more and 80 MPa or less and an elongation at break of 300% or more and 700% or less.

3. The electromagnetic wave shielding film according to claim 1, wherein
the conductive filler is silver powder.

4. The electromagnetic wave shielding film according to claim 1, wherein
the conductive filler is copper powder.

5. The electromagnetic wave shielding film according to claim 1, wherein
the conductive filler is silver-coated copper powder made of copper powder coated with silver.

* * * * *